United States Patent
Wu et al.

(10) Patent No.: US 9,418,999 B2
(45) Date of Patent: Aug. 16, 2016

(54) MIM CAPACITORS WITH IMPROVED RELIABILITY

(71) Applicant: Taiwan Semiconductor Manufacturing Company, Ltd., Hsin-Chu (TW)

(72) Inventors: Chih-Ta Wu, Hsin-Chu (TW); Jason Lee, Jhubei City (TW); Chung Chien Wang, Shanhua Township (TW); Hsing-Lien Lin, Hsin-Chu (TW); Yu-Jen Wang, Kaohsiung City (TW); Yeur-Luen Tu, Taichung (TW); Chern-Yow Hsu, Chu-Bei City (TW); Yuan-Hung Liu, Hsin-Chu (TW); Chi-Hsin Lo, Zhubei City (TW); Chia-Shiung Tsai, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/525,412

(22) Filed: Oct. 28, 2014

(65) Prior Publication Data
US 2015/0041874 A1 Feb. 12, 2015

Related U.S. Application Data

(63) Continuation of application No. 11/765,971, filed on Jun. 20, 2007, now Pat. No. 8,889,507.

(51) Int. Cl.
| | |
|---|---|
| H01L 21/8234 | (2006.01) |
| H01L 21/8244 | (2006.01) |
| H01L 27/108 | (2006.01) |
| H01L 49/02 | (2006.01) |

(52) U.S. Cl.
CPC .... *H01L 27/10814* (2013.01); *H01L 27/10852* (2013.01); *H01L 28/40* (2013.01); *H01L 28/75* (2013.01)

(58) Field of Classification Search
CPC ............. H01L 27/10852; H01L 28/75; H01L 27/10814; H01L 28/40; H01L 21/76895; H01L 27/10805; H01L 28/91; H01L 28/56; G11C 11/404; G11C 2211/4016; Y10S 257/906; Y10S 438/957
USPC ................. 438/239, 241, 253, 396, 648, 656; 257/296, 300, 312, E21.01, E21.35, 257/E21.645, E21.648
See application file for complete search history.

(56) References Cited

U.S. PATENT DOCUMENTS

| | | |
|---|---|---|
| 5,444,026 A | 8/1995 | Kim et al. |
| 6,043,529 A | 3/2000 | Hartner et al. |
| 6,124,213 A | 9/2000 | Usami et al. |
| 6,559,497 B2 | 5/2003 | Shih et al. |
| 6,885,056 B1 | 4/2005 | Dornisch et al. |

(Continued)

FOREIGN PATENT DOCUMENTS

CN 1436364 8/2003

*Primary Examiner* — Charles Garber
*Assistant Examiner* — Abdulfattah Mustapha
(74) *Attorney, Agent, or Firm* — Slater Matsil, LLP

(57) ABSTRACT

A capacitor and methods for forming the same are provided. The method includes forming a bottom electrode; treating the bottom electrode in an oxygen-containing environment to convert a top layer of the bottom electrode into a buffer layer; forming an insulating layer on the buffer layer; and forming a top electrode over the insulating layer.

19 Claims, 11 Drawing Sheets

(56) References Cited

U.S. PATENT DOCUMENTS

| | | |
|---|---|---|
| 7,071,066 B2 | 7/2006 | Wang et al. |
| 7,105,418 B2 | 9/2006 | Joo |
| 7,253,076 B1 | 8/2007 | Agarwal et al. |
| 2002/0022334 A1* | 2/2002 | Yang et al. .................... 438/396 |
| 2002/0037630 A1 | 3/2002 | Agarwal et al. |
| 2002/0055235 A1 | 5/2002 | Agarwal et al. |
| 2002/0074584 A1 | 6/2002 | Yang |
| 2002/0168847 A1 | 11/2002 | Narwankar et al. |
| 2002/0197793 A1 | 12/2002 | Dornfest et al. |
| 2003/0100162 A1 | 5/2003 | Joo |
| 2004/0219757 A1 | 11/2004 | Olewine et al. |
| 2005/0074980 A1 | 4/2005 | Yang |
| 2006/0234511 A1 | 10/2006 | Ohuchi |
| 2007/0222071 A1* | 9/2007 | Moon ............... H01L 21/76843 257/736 |
| 2007/0259212 A1 | 11/2007 | Park et al. |
| 2007/0267705 A1* | 11/2007 | Won et al. ..................... 257/379 |
| 2008/0251928 A1 | 10/2008 | Chang et al. |

* cited by examiner

US 9,418,999 B2

MIM CAPACITORS WITH IMPROVED RELIABILITY

PRIORITY CLAIM AND CROSS-REFERENCE

This application is a continuation of U.S. patent application Ser. No. 11/765,971, entitled "MIM Capacitors with Improved Reliability," filed on Jun. 20, 2007, which application is incorporated herein by reference.

TECHNICAL FIELD

This invention relates generally to capacitors, and more particularly to structures and fabrication methods of metal-insulator-metal (MIM) capacitors.

BACKGROUND

It is well known that capacitors can be created between layers of metal or polysilicon. Capacitors can either have a planar design, for reasons of process simplicity, or can have a three-dimensional design, resulting in a smaller footprint as commonly used in embedded dynamic random access memory (eDRAM) devices.

eDRAM devices typically consist of arrays of memory cells that perform two basic functions, particularly data access control performed by a transistor and also data retention performed by a capacitor. Binary data is stored as electrical charges in the capacitors in eDRAM memory cells. Contacts to the surrounding circuits are provided to the eDRAM memory cells. Due to leakage currents, eDRAM cells can retain information only for a limited period of time before they must be read and refreshed periodically. In a typical eDRAM construction, one side of the transistor is connected to one side of the capacitor, and the other side of the capacitor is connected to a reference voltage.

The capacitors used in the eDRAM memory cells are commonly referred to as metal-insulator-metal (MIM) capacitors. As is well known in the art, the capacitances of capacitors are related to the areas of the capacitors and the thicknesses and the dielectric constants (k values) of the insulators. To increase the capacitances of the capacitors, insulators preferably have high k values. However, in 90 nm and 65 nm technologies, the thicknesses of the insulators are typically below 100 Å, and in the reliability tests, capacitors having high-k insulators with such thicknesses only marginally passed the time dependent dielectric breakdown (TDDB) test. In future generations of integrated circuits, the thicknesses of the high-k insulators will continue to be scaled down. This will cause further reduction in TDDB lifetime, and hence the reliability of capacitors may not even pass the TDDB test. Accordingly, new capacitor structures and formation methods are needed.

SUMMARY OF THE INVENTION

In accordance with one aspect of the present invention, a method for forming a semiconductor structure includes forming a bottom electrode; treating the bottom electrode in an oxygen-containing environment to convert a top layer of the bottom electrode into a buffer layer; forming an insulating layer on the buffer layer; and forming a top electrode over the insulating layer.

In accordance with another aspect of the present invention, a method for forming a capacitor includes forming a bottom electrode; annealing the bottom electrode in an oxygen-containing environment to convert a top portion of the bottom electrode into a buffer layer, wherein the oxygen-containing environment comprises a gas or a plasma selected from the group consisting essentially of $O_2$, $O_3$ (ozone), and combinations thereof; forming an insulating layer on the buffer layer; and forming a top electrode on the insulating layer.

In accordance with yet another aspect of the present invention, a method for forming a semiconductor structure includes providing a semiconductor substrate; forming a transistor at a surface of the semiconductor substrate, wherein the transistor comprises a gate over the semiconductor substrate, and a drain and a source adjacent the gate; forming a first inter-layer dielectric (ILD) over the transistor; forming a first contact and a second contact in the ILD, wherein the first and the second contacts are connected to the drain and source, respectively; forming a second ILD over the first ILD; forming an opening in the second ILD; and forming a capacitor in the opening. The step of forming the capacitor includes forming a bottom electrode layer electrically connected to the first contact; forming a photo resist on the bottom electrode layer; patterning the bottom electrode layer to form a bottom electrode; ashing the photo resist; treating the bottom electrode in an oxygen-containing gas or a plasma after the step of ashing to convert a top portion of metal nitride into a buffer layer; forming an insulating layer on the buffer layer; and forming a top electrode over the insulating layer.

In accordance with yet another aspect of the present invention, a semiconductor structure includes a bottom electrode comprising a metal nitride; a buffer layer comprising a metal oxynitride on the bottom electrode, wherein the buffer layer and the bottom electrode comprise same metals, and wherein the buffer layer has a thickness of greater than about 50 Å; an insulating layer on the buffer layer; and a top electrode over the insulating layer.

In accordance with yet another aspect of the present invention, a semiconductor structure includes a bit-line and a transistor. The transistor includes a gate; a source adjacent the gate, wherein the source is electrically connected to the bit-line; and a drain adjacent the gate. The semiconductor structure further includes a first inter-layer dielectric (ILD) over the transistor; a first contact and a second contact in the ILD, wherein the first and the second contacts are connected to the drain and the source, respectively; a second ILD over the first ILD; an opening in the second ILD; and a capacitor in the opening. The capacitor includes a bottom electrode comprising a metal nitride, wherein the bottom electrode is electrically connected to either the source or the drain; a buffer layer comprising a metal oxynitride on the bottom electrode, wherein the buffer layer and the bottom electrode comprise same metals, and wherein the buffer layer has a thickness of greater than about 50 Å; an insulating layer on the buffer layer; and a top electrode over the insulating layer.

One of the advantageous features of the present invention is the improvement in the reliability of metal-insulator-metal capacitors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The formation of metal-insulator-metal (MIM) capacitor includes depositing and patterning bottom electrode, insulating layer and top electrode. Experiments made by the inventors have revealed that the surface conditions of the bottom electrode of the MIM capacitor are adversely affected by the ashing of the photo resist used for patterning the bottom electrode. This causes the degradation in the performance of the MIM capacitor. Based on this finding, novel MIM capacitor structures and the methods of forming the same are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
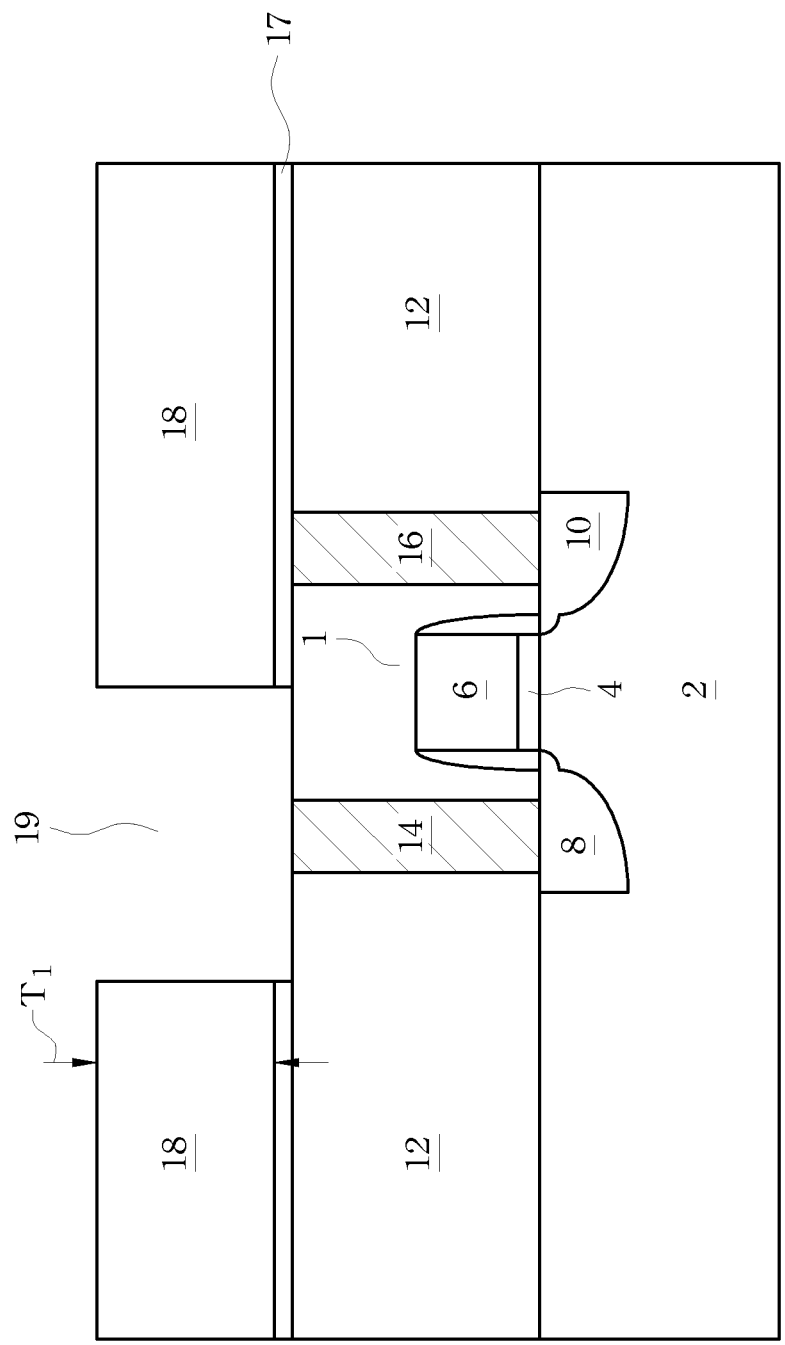
FIGS. 1 through 8 are cross-sectional views of intermediate stages in the manufacturing of a crown-type metal-insulator-metal (MIM) capacitor embodiment.

FIGS. 1 through 8 illustrate the formation of a crown-type MIM capacitor. Referring to FIG. 1, a starting structure including substrate 2 and selection transistor 1 formed on the surface of substrate 2, is provided. Selection transistor 1 includes drain region 8, source region 10, gate dielectric 4 and gate electrode 6. A contact etch stop layer (not shown) may be formed over transistor 1, followed by the formation of interlayer dielectric (ILD) 12 over the selection transistor 1. ILD 12 may include boronphosphosilicate glass (BPSG), silicon oxide, silicon nitride, silicon oxynitride, silicon carbide, carbon-containing low-k dielectrics, and the like. Contacts 14 and 16 are formed in ILD 12 to connect source region 10 and drain region 8 to overlying features.

Etch stop layer 17 may be formed over ILD 12, followed by the formation of ILD 18, also referred to as crown oxide 18. ILD 18 may include oxides, such as plasma enhanced chemical vapor deposition (PE-CVD) oxide, or high-density plasma (HDP) oxide, although other commonly used ILD materials, including low-k dielectric materials, can be used. The thickness $T_1$ of ILD 18 is preferably between about 800 Å and about 20000 Å, and more preferably about 7000 Å. One skilled in the art will realize, however, that the dimensions recited throughout the description are merely examples related to the technology used for forming the integrated circuits, and will be scaled accordingly with the scaling of the integrated circuits. Optionally, a chemical mechanical polish (CMP) stop layer (not shown) is formed over ILD 18. Opening 19 is then formed, exposing contact 14.

Figure 2A:
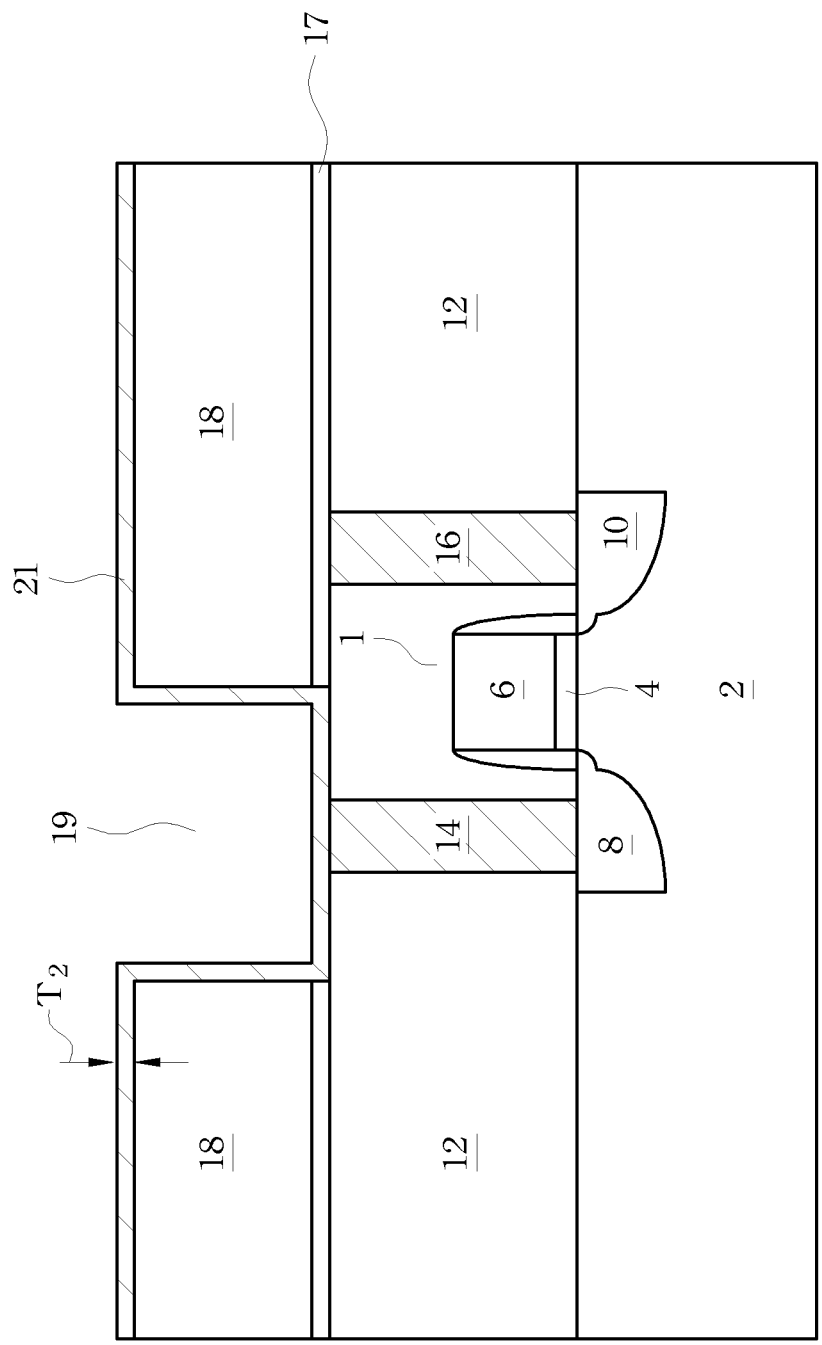
Figure 2B:
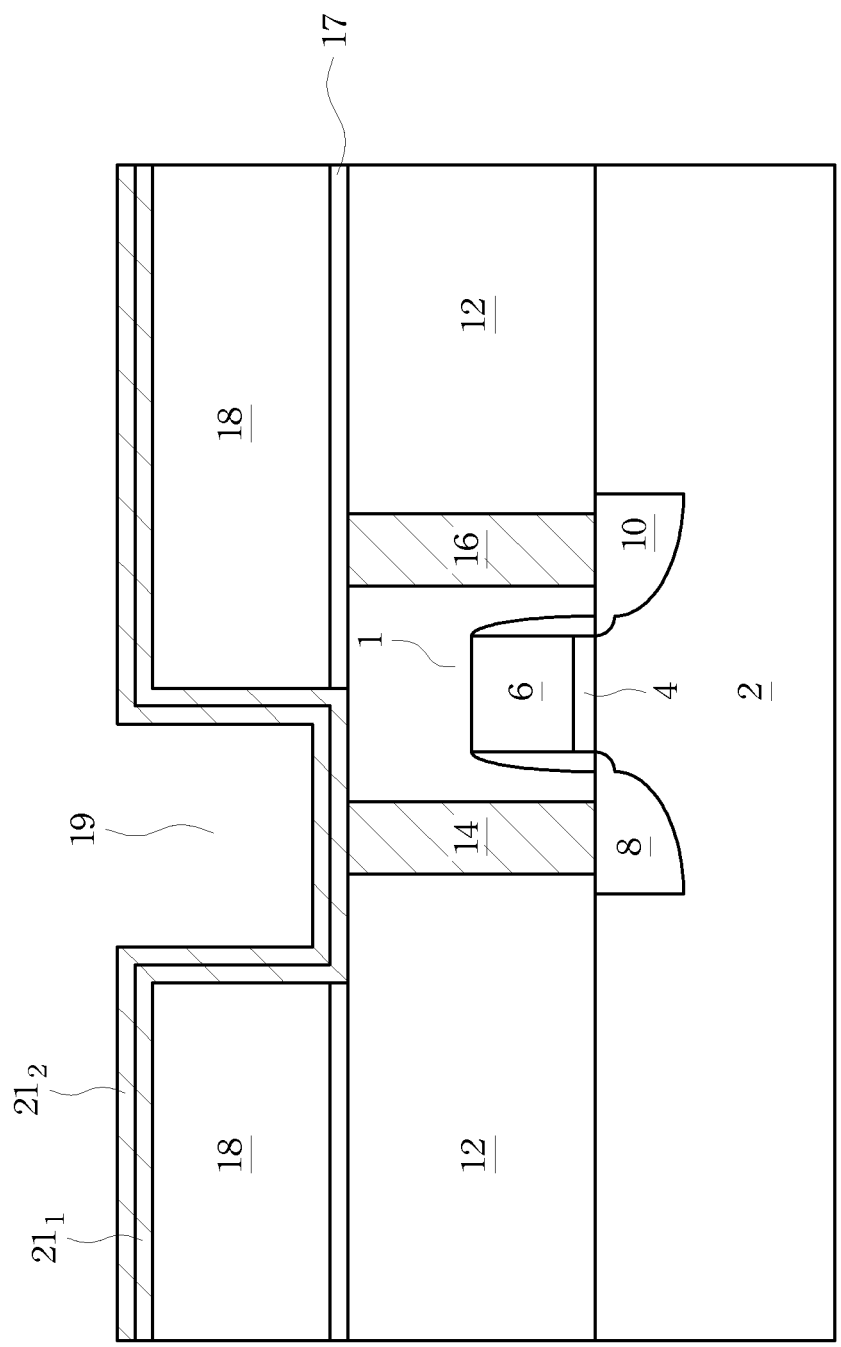

FIGS. 2A and 2B illustrate the formation of bottom electrode layer 21. Preferably, bottom electrode layer 21 is a metal-containing conductive layer. The preferred metals include a metal selected from titanium, tantalum, cobalt, tungsten, aluminum, and combinations thereof. In the preferred embodiment, bottom electrode layer 21 is formed using atomic-layer deposition (ALD), metal organic chemical vapor deposition (MOCVD), or the like. The thickness $T_2$ of bottom electrode layer 21 may be between about 50 Å and about 400 Å.

In an embodiment, as shown in FIG. 2A, bottom electrode layer 21 is a metal nitride layer. Alternatively, as shown in FIG. 2B, the formation of bottom electrode layer 21 may include forming a metal layer $21_1$, and then nitridating metal layer $21_1$. As a result, at least a surface layer of metal layer $21_1$ is nitridated, forming metal nitride layer $21_2$, while the bottom portion of the metal layer $21_1$ remains. In yet other embodiments, substantially an entirety of the metal layer $21_1$ is nitrided.

Figure 3:
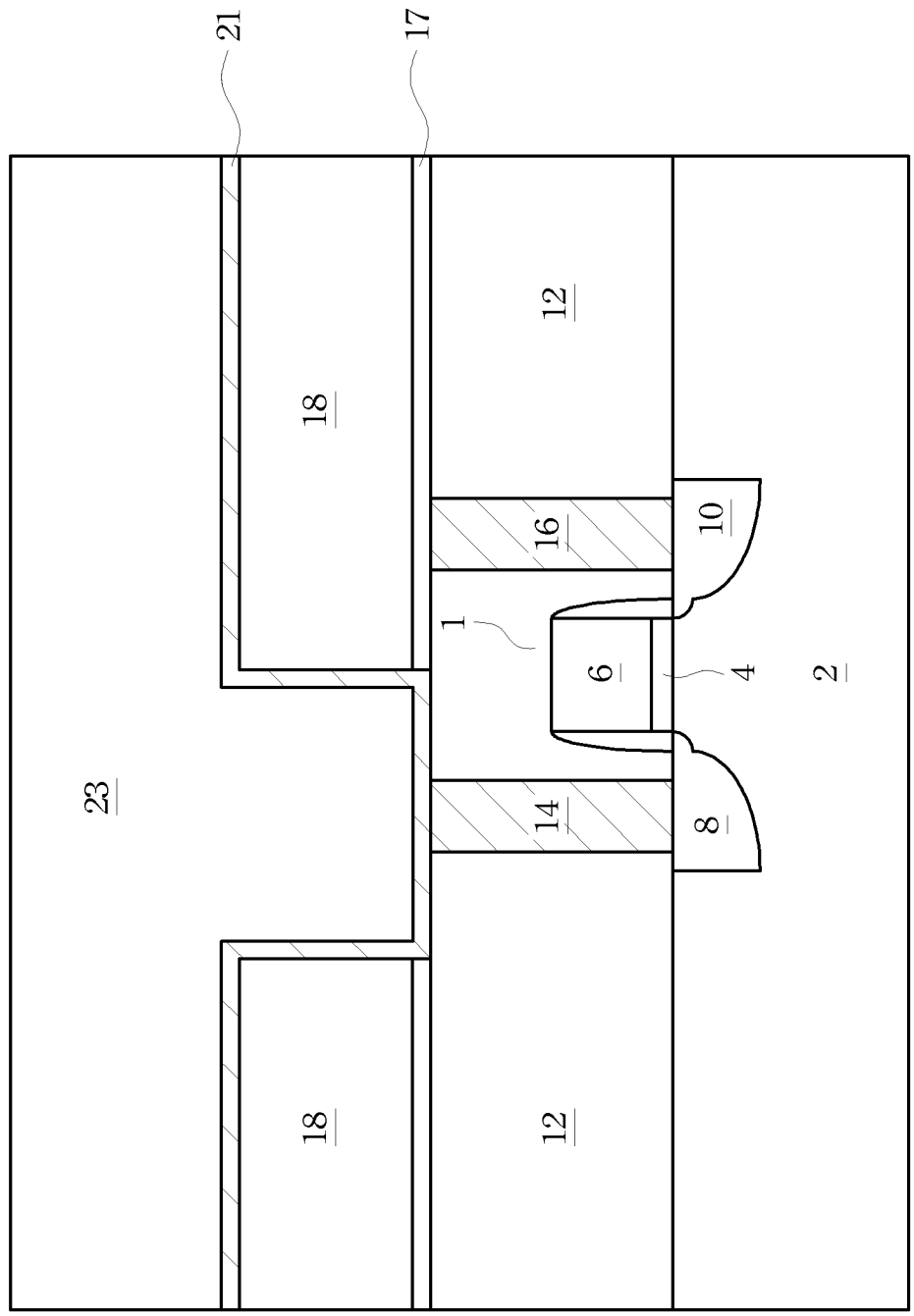
Figure 4A:
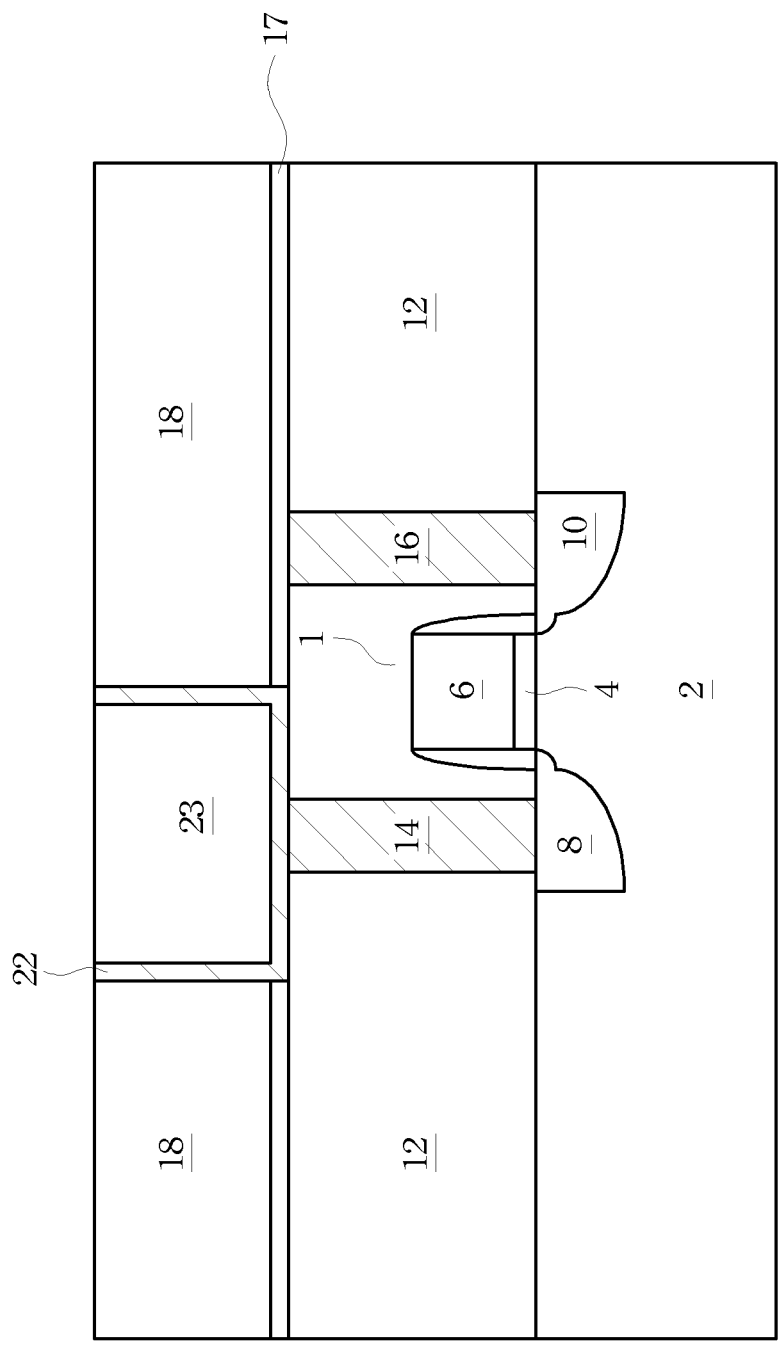
Figure 4B:
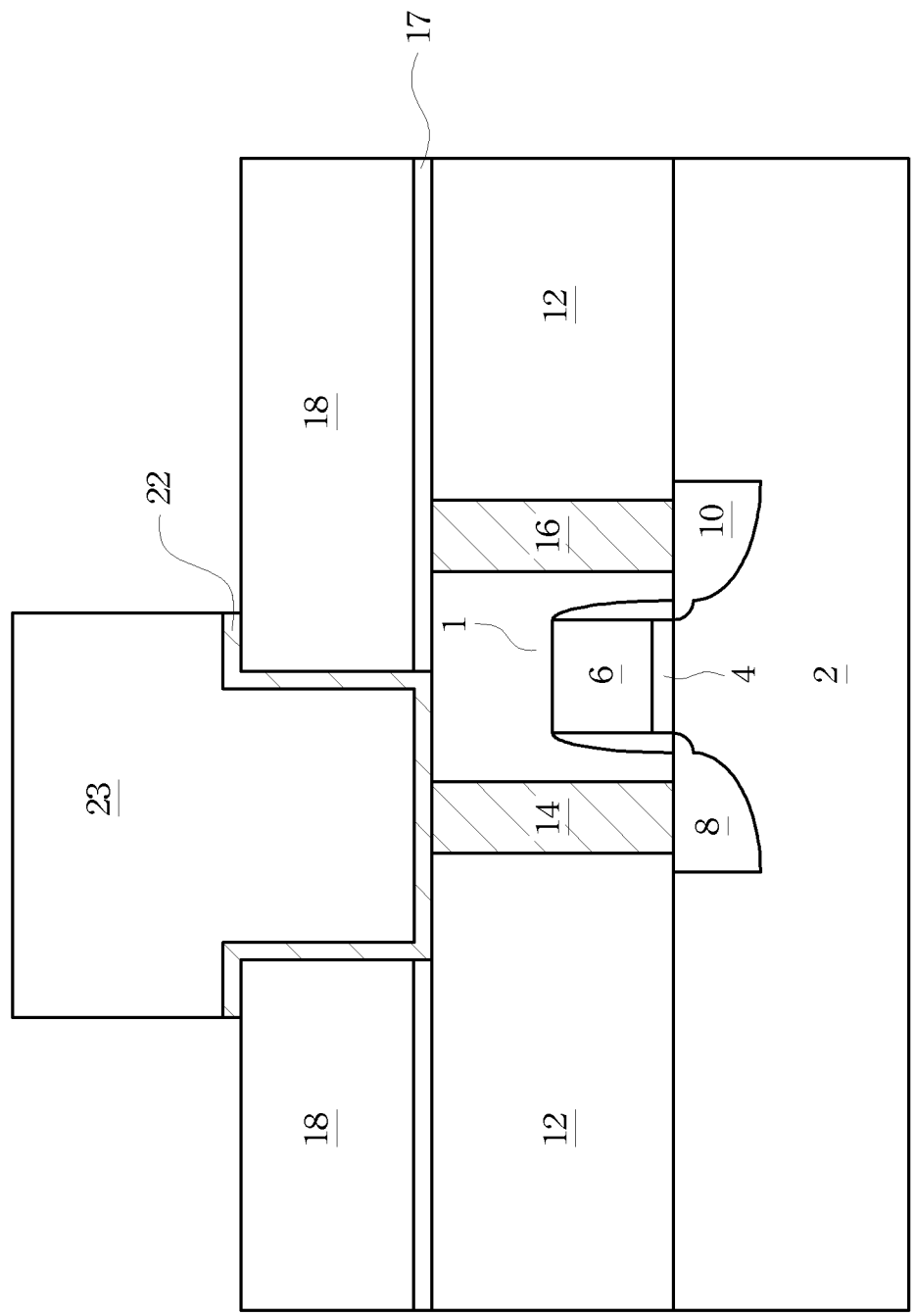

Referring to FIG. 3, photo resist 23 is applied. FIGS. 4A and 4B illustrate the patterning of bottom electrode layer 21. In an embodiment, a chemical mechanical polish (CMP) is performed to remove excess photo resist 23 and bottom electrode layer 21, until ILD 18 or the optionally formed CMP stop layer (not shown) is exposed. The portions of bottom electrode layer 21 on ILD 18 are thus removed, leaving bottom electrode 22, is shown in FIG. 4A. Alternatively, photo resist 23 is first patterned, and the exposed portions of bottom electrode layer 21 are etched, forming the structure as shown in FIG. 4B.

Figure 5:
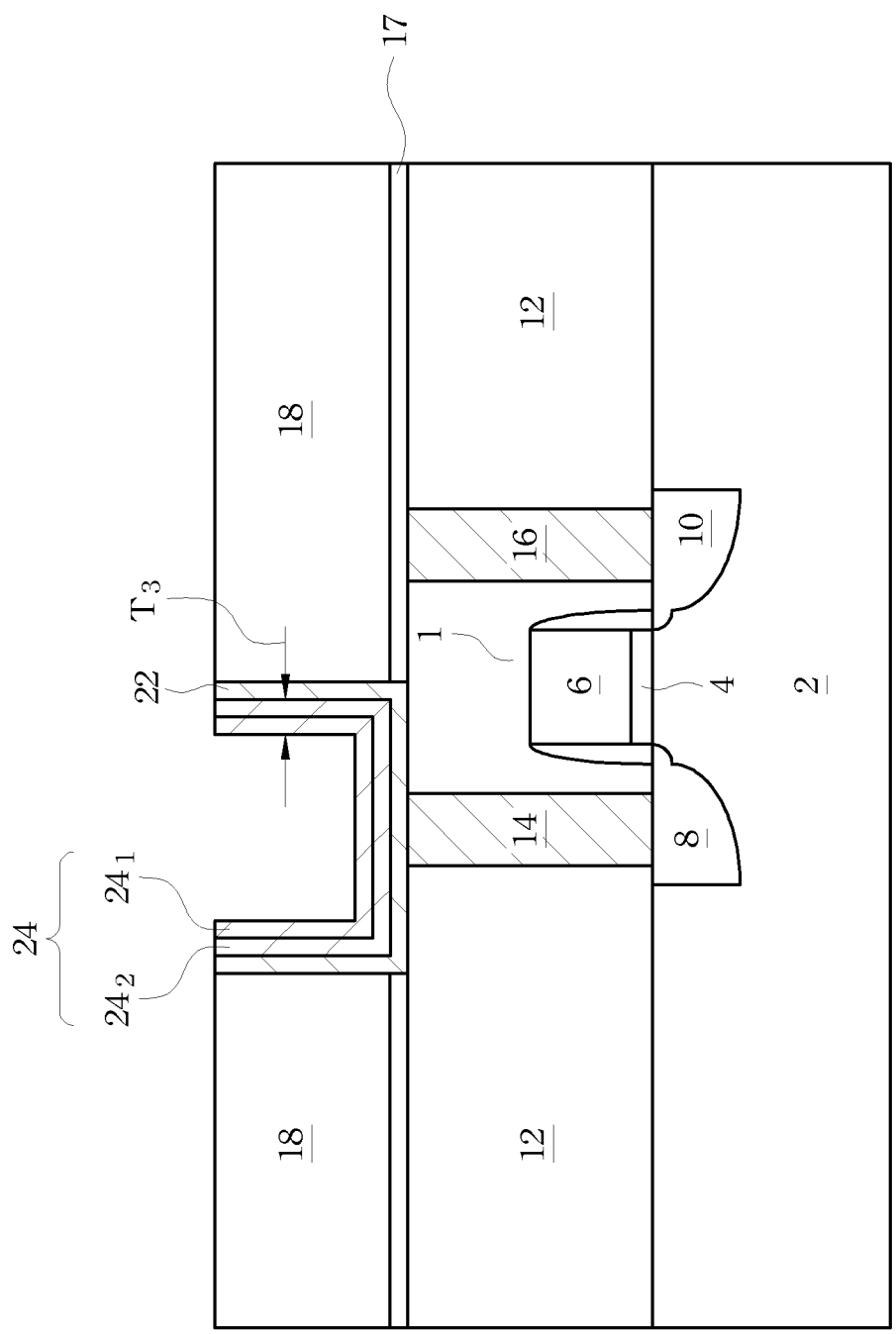

In FIG. 5, photo resist 23 is removed by an ashing process. In an exemplary embodiment, the ashing process is performed in oxygen ($O_2$) plasma, which may be generated by ICP (a trademark of Mattson Inc.). Preferably, the ashing process is performed at a temperature lower than about 300° C. In an exemplary embodiment, the ashing temperature is about 100° C. Alternatively, the ashing process is performed using Hiland (a trademark of Mattson Inc.).

During the ashing process, due to the existence of oxygen plasma, an interfacial layer $24_1$ is formed. Undesirably, interfacial layer $24_1$ is formed in an uncontrollable manner, and hence adversely affects the performance of the resulting MIM capacitor. In the preferred embodiment, by operating the ICP equipment at low temperatures or using the Hiland equipment, the thickness of interfacial layer $24_1$ is reduced. Preferably, interfacial layer $24_1$ has a thickness of less than about 15 Å. More preferably, a non-oxygen process is performed to remove photo resist 23, so that no interfacial layer $24_1$ is generated.

As also shown in FIG. 5, a treatment is performed on bottom electrode 22, converting at least a top portion of bottom electrode 22 into interfacial layer $24_2$, which may include a metal oxynitride if bottom electrode 22 is formed of metal nitride. Throughout the description, interfacial layers $24_1$ and $24_2$ are referred to as buffer layer 24. Preferably, the treatment includes an oxidation of the bottom electrode 22. In an exemplary embodiment, bottom electrode 22 is formed of titanium nitride, and hence titanium oxynitride is formed. The resulting buffer layer 24 preferably has a thickness $T_3$ of greater than about 50 Å, and more preferably between about 50 | and about 300 Å.

In an embodiment, the treatment is performed by soaking bottom electrode 22 in ozone ($O_3$). In an exemplary embodiment, the structure formed in the preceding paragraphs is placed in a reaction chamber, and ozone is introduced with a great flow rate, for example, greater than about 500 sccm. As a result, the top portion of bottom electrode 22 is oxidized. In the case bottom electrode 22 is formed of metal nitride, the metal nitride is converted into metal oxynitride (buffer layer 24). The reaction chamber preferably has an ozone pressure of between about 1 torr and about 20 torr. The treatment may be performed at the room temperature or higher temperatures. The treatment duration may be between about 0.5 and about 10 minutes.

In an embodiment, the treatment may be performed thermally in an oxygen-containing environment. Preferably, the reaction temperature is higher than about 300 degrees, and more preferably between about 100 degrees and about 500 degrees. In an exemplary embodiment, the treatment is performed in a reaction chamber, in which ozone is introduced with a flow rate of about 500 sccm to about 15000 sccm. Alternatively, $O_2$ and/or other reaction gases, such as $N_2O$ may be used. Preferably, the treatment time is between about 0.5 and about 10 minutes, although different treatment time may be used, depending on the oxidation rate.

In the embodiments discussed in the preceding paragraphs, since buffer layer 24 is formed by oxidizing bottom electrode 22, an atomic ratio of metals to nitrogen in buffer layer 24 is substantially the same as an atomic ratio of metals to nitrogen in bottom electrode 22.

Figure 6:
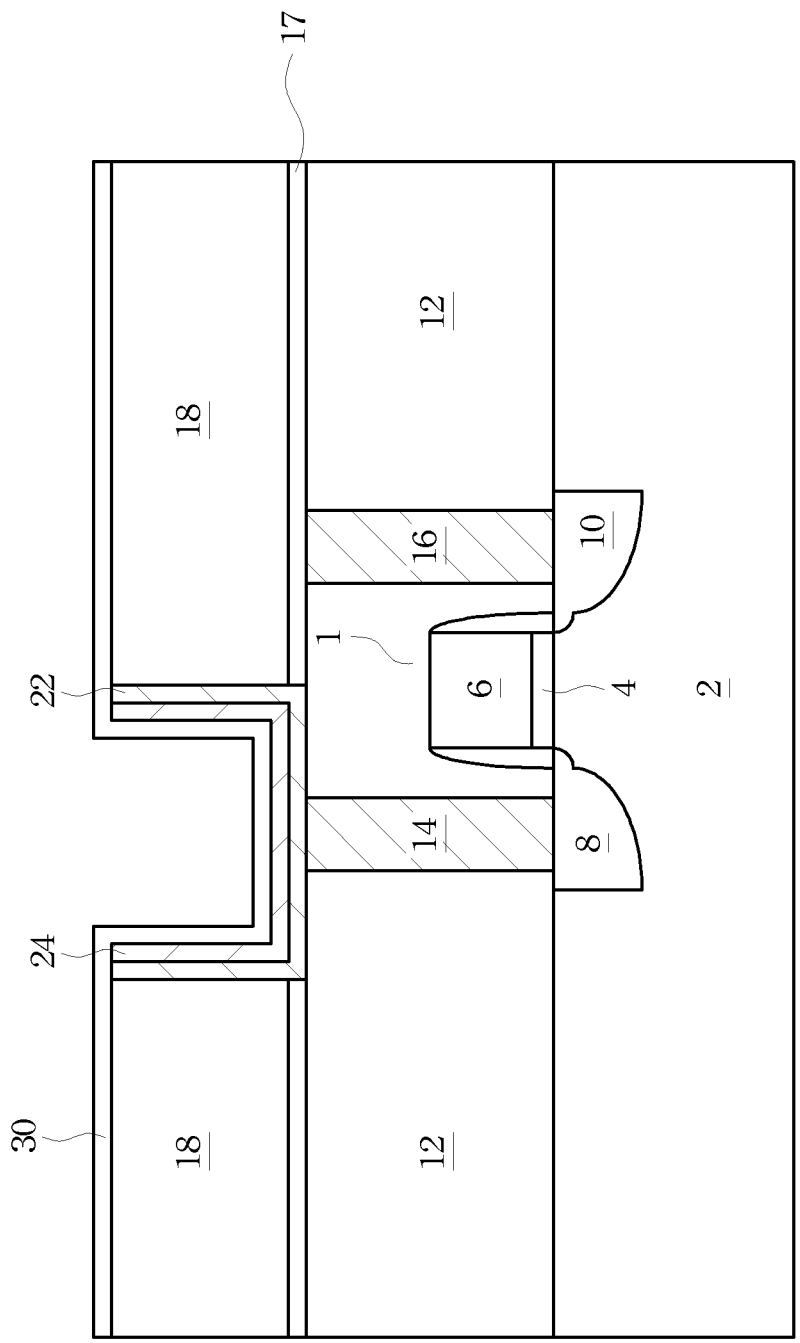

Referring to FIG. 6, insulating layer 30 is formed on buffer layer 24. Preferably, insulating layer 30 has a dielectric constant (k value) of greater than about 3.9, and hence is referred to as high-k dielectric layer 30 throughout the description. In the present embodiment, high-k dielectric layer 30 includes a high-k metal oxide such as $HfO_2$, $Al_2O_3$, $ZrO_2$, $Ta_2O_5$, and combinations thereof. High-k dielectric layer 30 can be formed using ALD, molecular-beam epitaxy (MBE), CVD, and the like. Preferably, high-k dielectric layer 30 has a thickness of less than about 100Å.

Figure 7:
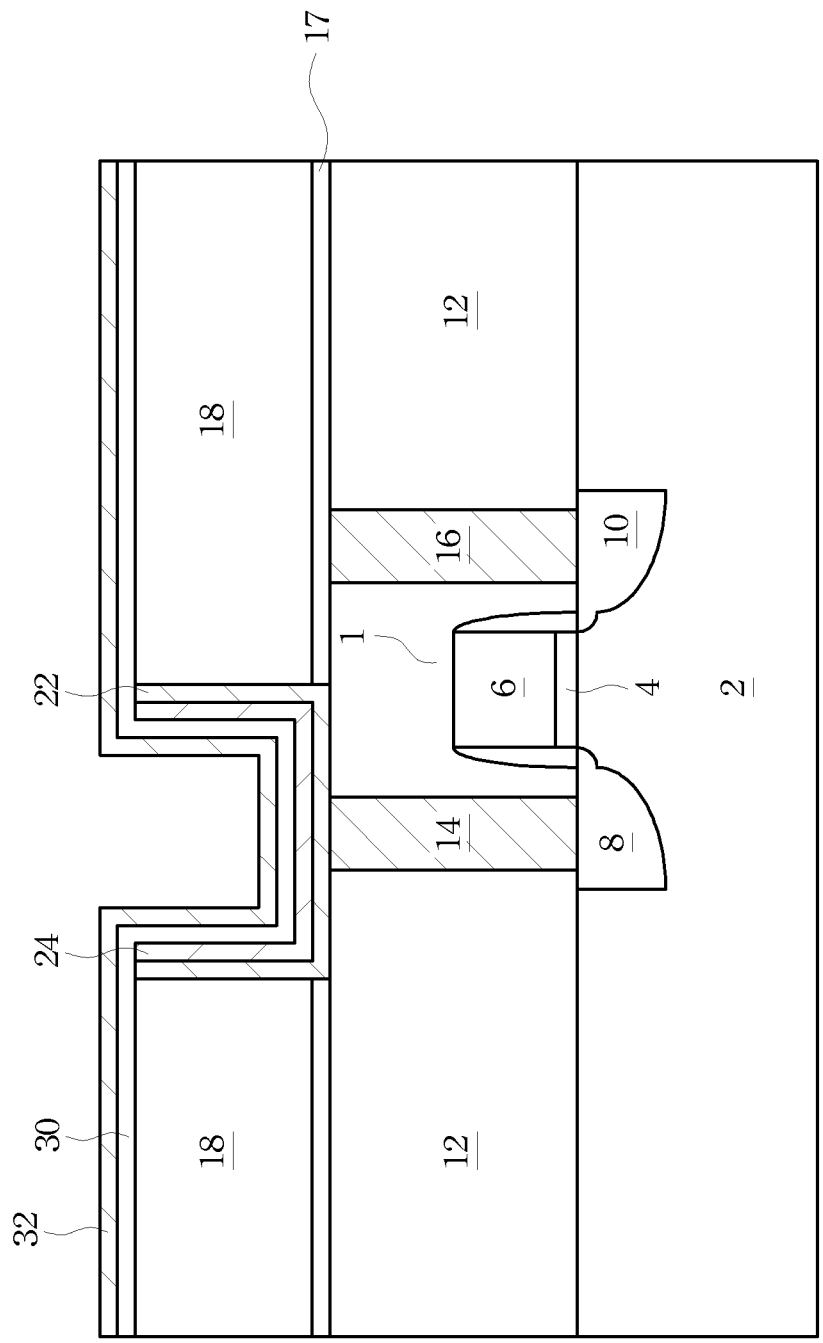
Figure 8:
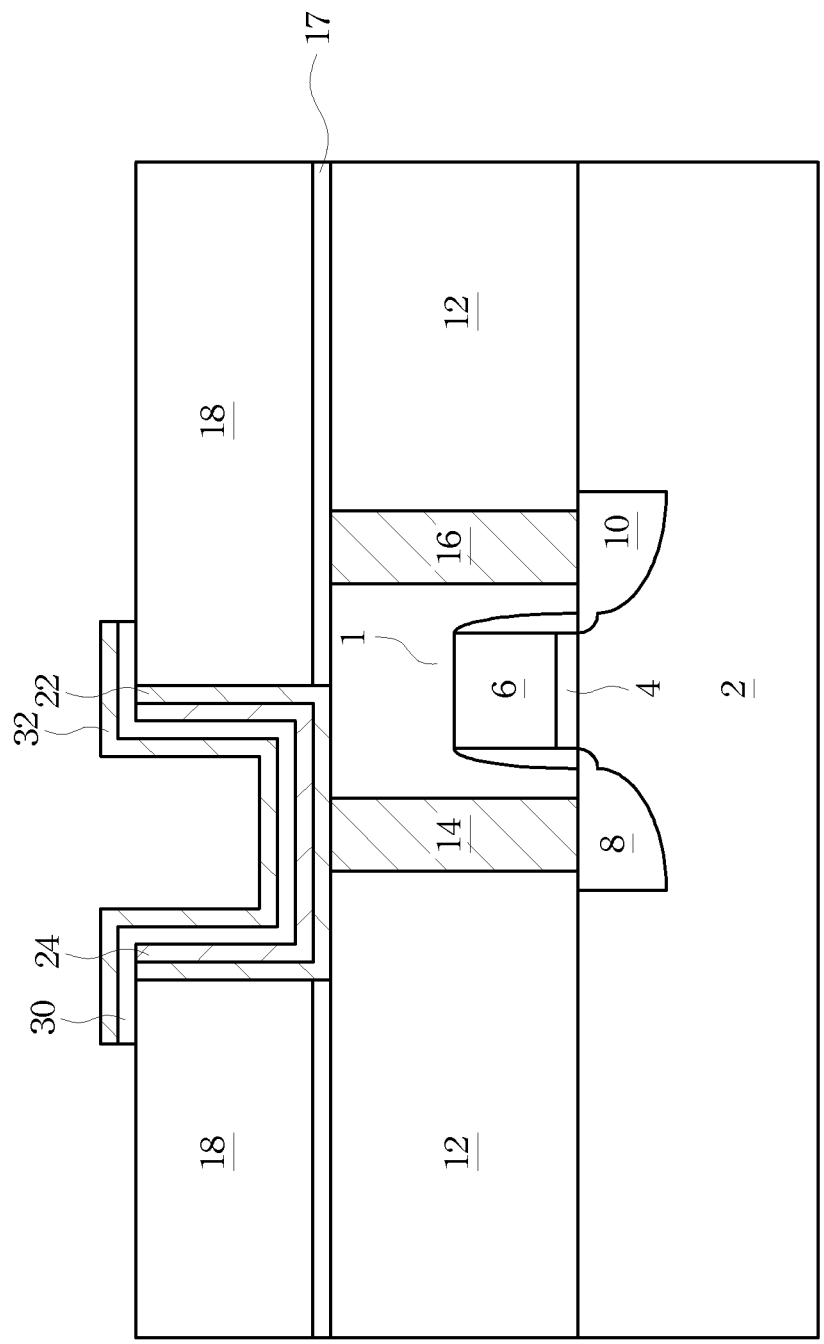

FIG. 7 illustrates the formation of top electrode 32, which may be formed using essentially the same materials as bottom electrode 22, although different materials and formation processes can be used. Preferably, top electrode 32 has a thickness of between about 50 Å and about 1000 Å. The insulating layer 30 and top electrode 32 are then patterned.

Figure 9:
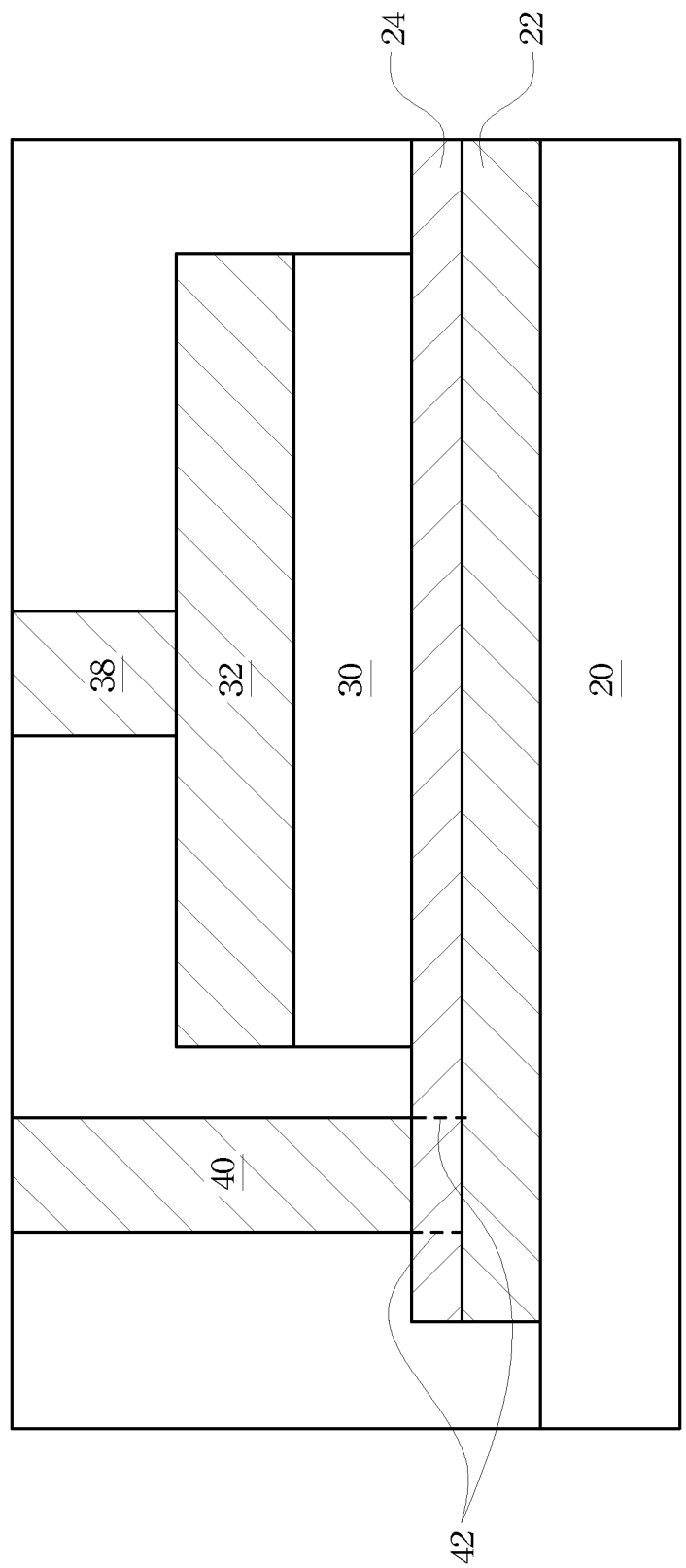
FIG. 9 illustrates a cross-sectional view of a planar MIM capacitor.

In the embodiments discussed in the preceding paragraphs, a crown-type MIM capacitor is formed. FIG. 9 illustrates a planar MIM capacitor, which includes bottom electrode 22, buffer layer 24, insulating layer 30 and top electrode 32. Preferably, the bottom electrode 22 is treated using a similar process as discussed in the preceding paragraphs to form buffer layer 24.

FIG. 9 also illustrates the formation of top electrode contact 38 and bottom electrode contact 40 overlying top electrode 32 and bottom electrode 22, respectively. In an embodiment, bottom electrode contact 40 may be landed on buffer layer 24. Alternatively, due to the fact that metal oxynitrides (such as titanium oxynitride) may have higher resistivities than metal nitrides (such as titanium nitride), bottom electrode contact 40 may penetrate through buffer layer 24 and physically contacts bottom electrode 22. The broken lines 42 illustrate the extension of bottom electrode contact 40 into buffer layer 24.

The embodiments of the present invention have several advantageous features. In existing MIM capacitor formation processes, methods such as ALD and MOCVD are commonly used to form bottom electrodes of MIM capacitors. In very small-scale integrated circuits, these methods caused the surface conditions of the bottom electrodes that were unable to fulfill the requirements of the increasingly thinner insulators. The formation of the buffer layers, which is performed in a controllable manner, improves the interface between bottom electrode 22 and insulating layer 30. Thus, the surface roughness of the bottom electrodes is reduced.

The embodiments of the present invention have significantly improved the lifetime of MIM capacitors. Experiments have been performed to compare a first group of sample capacitors, whose formation includes annealing bottom electrode 22 in $O_3$, and a second sample group of sample capacitors, whose formation includes no $O_3$ annealing. In the stress test, it was found that the TDDB lifetime of the first sample group was nearly two orders greater than the TDDB lifetime of the second sample group. On the other hand, a third and a fourth samples are formed with and without the $O_3$ anneal, respectively. The capacitance of the third sample is found to be 6.6 percent higher than the fourth sample. The positive and negative breakdown voltages of the third sample are improved by about 15.4 percent and about 25.9 percent over the fourth sample, respectively. Therefore, a conclusion may be drawn that the embodiments of the present invention have a better performance over conventional MIM capacitors.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a bottom electrode comprising:
      a metal layer; and
      a metal nitride layer over the metal layer;
   a metal oxynitride layer over the bottom electrode, wherein the metal oxynitride layer and the bottom electrode comprise same metals, wherein a first atom ratio of metal-to-nitrogen in the metal nitride layer is substantially equal to a second metal-to-nitrogen in the metal oxynitride layer;
   an insulating layer over the metal oxynitride layer; and
   a top electrode over the insulating layer.

2. The device of claim 1, wherein the metal layer and the metal nitride layer comprise same metals.

3. The device of claim 1 further comprising a dielectric layer, wherein the bottom electrode and the metal oxynitride layer are in the dielectric layer, and wherein each of the insulating layer and the top electrode comprises a first portion extending into the dielectric layer, and a second portion overlapping the dielectric layer.

4. The device of claim 1, wherein the metal oxynitride layer comprises titanium oxynitride.

5. The device of claim 1, wherein the metal oxynitride layer comprises tantalum oxynitride.

6. The device of claim 1, wherein the insulating layer contacts the metal oxynitride layer.

7. The device of claim 1, wherein the insulating layer comprises a high-k dielectric material.

8. The device of claim 1, wherein the insulating layer comprises $HfO_2$.

9. The device of claim 1 further comprising:
   a transistor comprising:
      first source/drain region connected to one of the bottom electrode and the top electrode; and
      second source/drain region connected to a bit-line.

10. The device of claim 1, wherein the insulating layer physically adjoins the top electrode.

11. A device comprising:
    a capacitor comprising:

a metal nitride layer, wherein the metal nitride layer has a first atomic ratio of metal to nitrogen;

a metal oxynitride layer over the metal nitride layer, wherein the metal oxynitride layer and the metal nitride layer comprise same metals, and the metal oxynitride layer has a second atomic ratio of metal to nitrogen, with the second atomic ratio equal to the first atomic ratio;

an insulating layer over the metal oxynitride layer; and a top electrode over the insulating layer.

12. The device of claim 11 further comprising a metal layer underlying the metal nitride layer, wherein the metal layer and the metal nitride layer comprise same metals.

13. The device of claim 11 further comprising a dielectric layer, wherein the metal nitride layer and the metal oxynitride layer are in the dielectric layer, and wherein each of the insulating layer and the top electrode comprises a first portion extending into the dielectric layer, and a second portion overlapping the dielectric layer.

14. The device of claim 11, wherein the metal nitride layer comprises titanium.

15. The device of claim 11, wherein the insulating layer comprises a high-k dielectric material.

16. A device comprising:
a transistor comprising:
a gate; and
a source/drain region adjacent the gate;
a first inter-layer dielectric (ILD) over the transistor;
a contact plug in the first ILD and connected to the source/drain region;
a second ILD over the first ILD; and
a capacitor in the second ILD, the capacitor comprising:
a bottom electrode comprising a metal nitride, wherein the bottom electrode is electrically connected to the source/drain region;
a buffer layer comprising a metal oxynitride over the bottom electrode, wherein the buffer layer and the bottom electrode comprise same metals;
an insulating layer over the buffer layer; and
a top electrode over the insulating layer.

17. The device of claim 16, wherein the metal oxynitride and the metal nitride comprise a same metal, wherein the metal nitride has a first atomic ratio of the same metal to nitrogen, and the metal oxynitride has a second atomic ratio of the same metal to nitrogen, with the second atomic ratio equal to the first atomic ratio.

18. The device of claim 16, wherein the buffer layer comprises tantalum oxynitride.

19. The device of claim 16, wherein the insulating layer comprises a material selected from the group consisting essentially of $HfO_2$, $Al_2O_3$, $ZrO_2$, $Ta_2O_5$, and combinations thereof.

* * * * *